United States Patent [19]

Miller

[11] Patent Number: 4,578,032
[45] Date of Patent: Mar. 25, 1986

[54] WORKPIECE HEATER

[76] Inventor: C. Fredrick Miller, 1551 E. Pacifico Ave., Anaheim, Calif. 92805

[21] Appl. No.: 674,790

[22] Filed: Nov. 26, 1984

[51] Int. Cl.$^4$ .......................... F24J 3/00; F27D 23/00; F27D 11/00; F27B 9/06
[52] U.S. Cl. .................................... 432/230; 219/385; 219/388; 432/249
[58] Field of Search ............... 432/138, 226, 230, 249; 219/215, 385, 388, 392

[56] References Cited

U.S. PATENT DOCUMENTS

| | | | |
|---|---|---|---|
| 2,344,035 | 3/1944 | Etten | 432/226 |
| 2,525,407 | 10/1950 | Frei | 432/138 |
| 2,573,266 | 10/1951 | Melcher et al. | 432/230 |
| 3,277,813 | 10/1966 | Luscher | 219/388 |
| 4,470,805 | 9/1984 | Gollan | 432/142 |

Primary Examiner—John J. Camby
Attorney, Agent, or Firm—Grover A. Frater

[57] ABSTRACT

A workpiece heater suitable for use in heating electronic micro circuitry while minimizing work displacement as an incident to expansion and contraction of the structural components of the heater employs a rotatable work table and a heater disposed to heat the table by radiation. The table is mounted on a shaft supported against axial movement by a tapered bearing. The bearing is pre-loaded by a spring arranged to urge the shaft against the bearing. That structural arrangement is combined with the use of elongated elements and reflecting shields to minimize heat transfer to the mechanism by which the worktable shaft is rotated.

15 Claims, 6 Drawing Figures

WORKPIECE HEATER

TECHNICAL FIELD

This invention relates to a workpiece heater, and it relates in particular to an apparatus for heating and positioning electronic components on which bonding operations are to be accomplished.

BACKGROUND ART

While the invention has other application, it is particularly well suited to the task of positioning and heating electronic components at the work stations of ultrasonic, wire bonding machines. The current universally accepted method of completing wire connections between circuit points in micro circuitry utilizes sonic energy applied to the wire at the point at which the wire overlies the circuit. The wires are formed of gold or aluminum. They are maleable and may be less than one mil in diameter, and, while the forces applied by the bonding tools are very small, the wire is easily damaged in the process of applying bonding energy. The problem of wire damage can be overcome in large measure by heating the circuit point to which the wire is to be bonded. Heating facilitates bonding so that it is accomplished in less time and with less force. That is true especially in the case of gold wire and gold plated circuits, and it is common practice to heat the circuit to temperatures in the range of 300–500 degrees centrigrade. At 500 degrees centrigrade, steel color changes to light straw. Many materials that could otherwise be employed in work place construction cannot withstand such temperatures. Materials that can be used may undergo significant degrees of expansion.

Once the workpiece is positioned in a predefined initial position under the bonding tool, and its rotational orientation is correct, the tool may be controlled to execute a series of bonding and wire payout and severing events. The work holder is rotated to rotate the workpiece according to some predefined program. But whether the task is to be accomplished in such semiautomatic fashion or manually, the quality of the finished work is likely to depend upon the ability of the holder to ensure that its axis of rotation is not tilted or translated and to maintain the workpiece in the prescribed position. The circuit pads to which the wires are bonded may have an area comparable to the cross-sectional area of a human hair. In that circumstance, even minute dimensional changes in the work station present a major difficulty. The work station is necessarily large enough for manual manipulation. Its dimensions are several orders of magnitude greater than the dimensions of the circuit pads. Dimensional change and back lash, which is a very small percentage of work station size, can readily represent huge, intolerable changes when translated to the workpiece.

Heated work stations have been employed in the past, but prior stations were little more than the combination of a heater mounted in a portable stand and a clamp by which to hold a workpiece. The function of such stations was limited to holding the workpiece steady. All positioning was accomplished by positioning of the tool at each bonding point.

DISCLOSURE OF INVENTION

It is an object of the invention to provide an improved heated work station.

Another object is to provide a work station which permits rotational orientation such that the axis of rotation does not change significantly with temperature or with the mass or orientation of the workpiece.

It is another object to provide a rotatable, heated work station whose design makes it useful for manual rotation or for programmed rotation. A related object is to provide an improved combination of heated work station and work station rotator.

Manual positioning, as opposed to automated positioning, is employed when production volumes are small or when the arrangement of the workpiece makes automation unduly difficult or complex. That positioning is manual does not diminish the requirement for reliable, high quality bonds, and it is important that the work station be easy to position and to rotate, and that rotation be easy to stop, and that the operator need have no fear of being burned, and that nothing in work station design contribute to operator fatigue.

To provide an apparatus and method which is capable of accurate, reliable bonding, and which will enable an operator to achieve such bonding repeatedly is another object of the invention.

These and other objects and advantages of the invention, which will become apparent upon examination of the drawing and the following specification, are provided, in part, by improved bearing construction, preloading of bearings, component arrangement providing special thermal isolation, improved rotary drive, and by other features which provide individual advantage and enhanced advantage in combination.

DESCRIPTION OF PREFERRED EMBODIMENT

Figure 1:
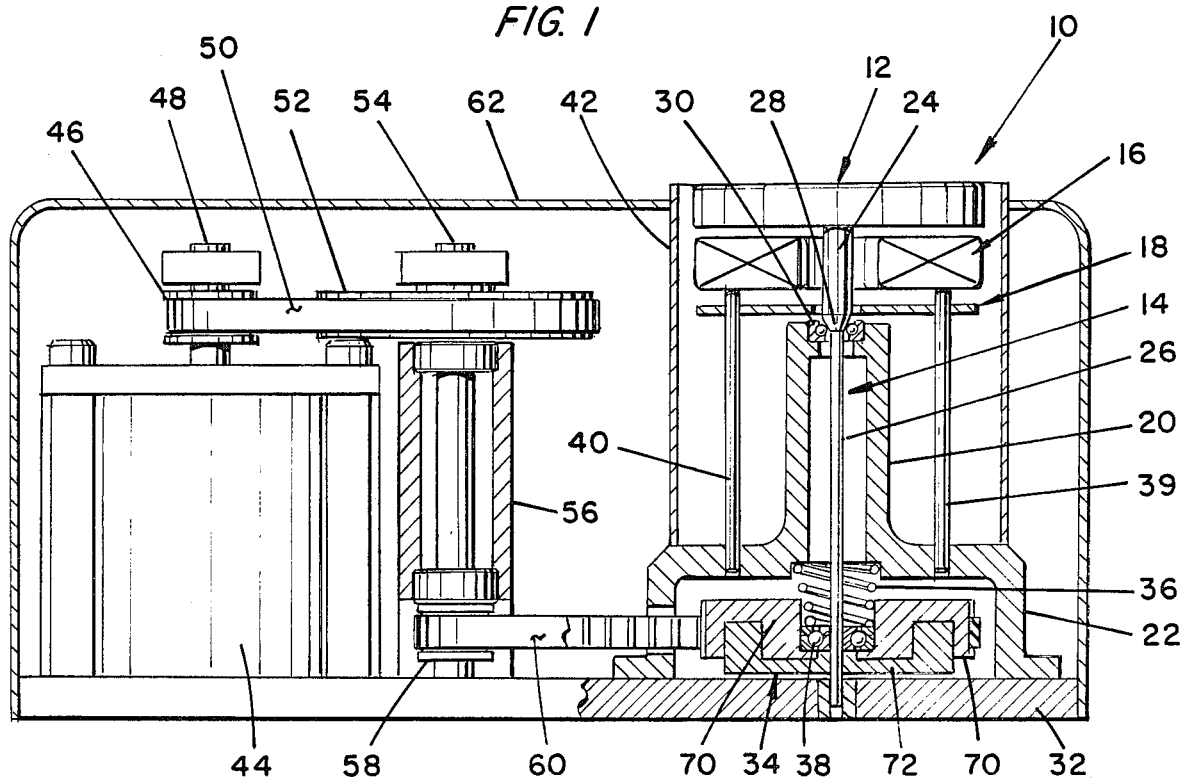
FIG. 1 is an elevational view, partly in section, of a programmable version of a rotatable, heated work station of preferred form in which the invention is embodied.
Figure 2:
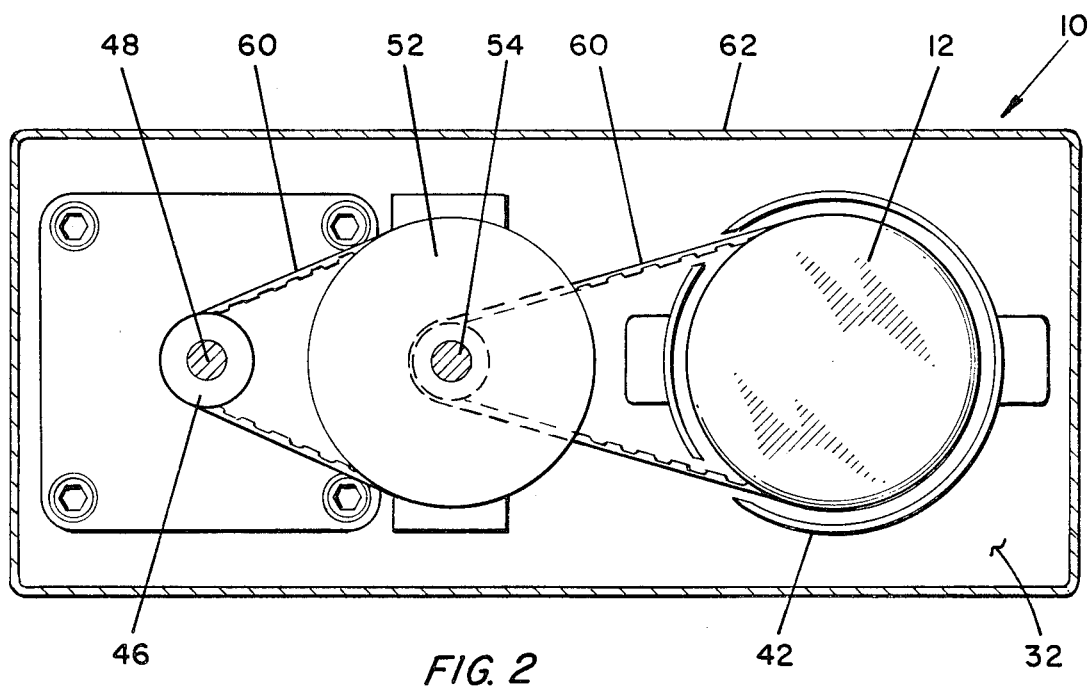
FIG. 2 is a top plan view of the work station of FIG. 1.

The motorized work station 10 of FIG. 1 includes a work table 12 in the form of a rotatable metal disc fixed on its axis to a shaft 14 which extends downwardly from the lower face of the disc through the central opening of an electric heater 16 of annulus form. The shaft continues through the central opening of a heat shield disc 18 into a hollow pedestal 20 which, in this case, has the form of a cylinder formed integrally at its lower end with a bell housing shaped base 22.

Figure 3:
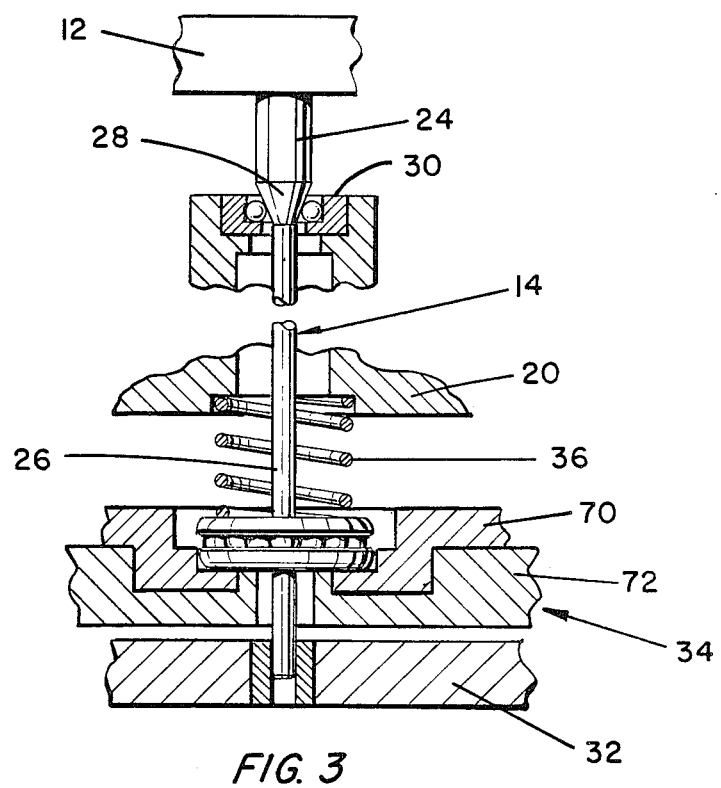
FIG. 3 is a schematic drawing of the bearing and bearing preload arrangement of FIG. 1.

The shaft 14 has a larger diameter at its upper section 24 than at its lower section 26. The transition from larger to smaller diameter occurs at a tapered section 28 (see FIG. 3). The shaft extends through and is supported by a tapered bearing 30 at the tapered section. The bearing, which is fixed in the upper end of the pedestal, serves both as a thrust bearing to support the worktable 12 and to restrain the shaft and worktable against lateral displacement. At its lower end, the shaft 14 is journalled in a base plate 32. A toothed pulley assembly 34 is fixed to section 26 of shaft 14 so that it is disposed within the base 22. Rotation of the pulley 34 causes rotation of shaft 14 and the worktable 12 about the axis of the shaft.

Downward, axial translation of shaft 14 is limited by the tapered bearing 30. Upward translation is opposed by a compression spring 36 which is trapped between the inner upper face of the base 22 at the lower end of the pedestal 20 and one race of a ball bearing 38 whose other race bears against the pulley assembly 34. The effect of that construction is to preload the tapered bearing 30 by biasing the shaft downwardly.

The heater 16 is supported by long, slender posts whose lower ends are fixed in the base 22. There are three of those posts in this embodiment. Two of them, 39 and 40, respectively, are visible in FIG. 1. The shield 18 is supported on those same posts. The heater is positioned close to the worktable and heats the table by radiation. The shield is mounted close to the underside of the heater. Its function is to reflect radiation from the heater and thus shield the air space between the shield and base and to shield the bearing at the upper end of the pedestal.

The heater and shield mounting posts 39 and 40, the pedestal 20 and the lower section 26 of the shaft 14 are all elongated whereby to isolate the base 22 and the elements disposed within the base. The object is to insulate them from the high temperatures of the worktable and the heater. Radial symmetry in the worktable and shaft 14 and bearings 30 and 38 and in the heater itself help sensure against changes in the position of the rotational axis with temperature change. The upper section 24 of shaft 14 is relatively short so the heat flowpath between it and the worktable is short. The table itself is a large heat sink and the upper end of the shaft is relatively large in diameter. As a consequence, temperature changes in the upper shaft, and so dimensional changes incident to expansion and contraction will be very small notwithstanding changes in heater temperature as heater energy is cycled on and off.

Expansion and contraction of the lower section 26 of shaft 14 do not alter the height of the worktable because the position of the tapered section 28 of the shaft 14 is fixed by the position of the bearing 30. Dimensional change of the lower section of the shaft only alters the degree of compression of the spring 36. Elongation and contraction of the pedestal 20 would alter bearing 30 position, but the pedestal is protected from radiated heat by reflector 18, and the conduction path from the worktable and shaft to the pedestal is limited to point contacts in bearing 30 at the upper end of the pedestal and to point contacts in bearing 38 and the long spring path at its lower end.

The region surrounding the heater is protected by a cylindrical reflector 42. The lower end of that reflector is fixed to the upper side of base 22. Thus, there is no lower air inlet and the reflector 42 exhibits no chimney effect. The upper end of the pedestal is closed by bearing 30 and the shaft so that it cannot serve as a chimney. The result is the provision of a worktable which is not translated up or down or laterally as the heater is cycled on and off in an effort to maintain uniform table temperature. Moreover, the height of the table does not change materially over a very wide range of temperatures. As a consequence, the tools that accomplish wire bonding need not be adjusted to accommodate work station height when different table temperatures are maintained.

In this embodiment the worktable is rotated by a drive train that includes a stepping motor 44 having a pulley 46 fixed to the motor shaft 48. A belt 50 which is driven by pulley 46 drives a pulley 52 to drive a shaft 54. The shaft is journalled in an upright pillow block 56 and has a pulley 58 fixed to its lower end. A second belt 60 is driven by pulley 58 to drive the pulley 34. In this preferred embodiment the belts and the several pulleys are toothed to facilitate computer control of worktable positioning by motor pulsing. An outer cover 62 protects the operator from the positioning apparatus and from the heater and reflector shield 42. It also serves to protect that apparatus.

Preloading of the upper bearing 30 can be accomplished by any of several structural arrangements. That task is performed by compression spring 36 and, as will be described below, it can be accomplished with a cantilever spring. The forces of magnetic attraction and repulsion and of gravity can also be used. In fact, both are used in this embodiment. The weight of the turntable 12 and shaft 14 and of the pulley serves to preload the bearing although, in this case, the weight is limited to limit inertia and is augmented by the spring. To that is added magnetic attraction. The pulley 34 is formed of two pieces numbered 70 and 72. The lower one, 72, is a ceramic magnet which is attracted to the steel base plate 32. In most cases, the preferred primary means for providing bearing preloading will be a spring.

The construction of the preferred manually operated work station 100 includes the turntable and heater and shields and bearings and spring and base and pots and pedestal of the motorized version. The form of some of those elements differs somewhat but their basic functions correspond to those of the motorized version.

Added elements include a thumbwheel which is rotatable on a shaft carried by the base, a chain drive connecting a sprocket carried by the thumbwheel with another carried by the worktable shaft, a lever operated workpiece clamp, and a thumbwheel clamp.

Figure 4:
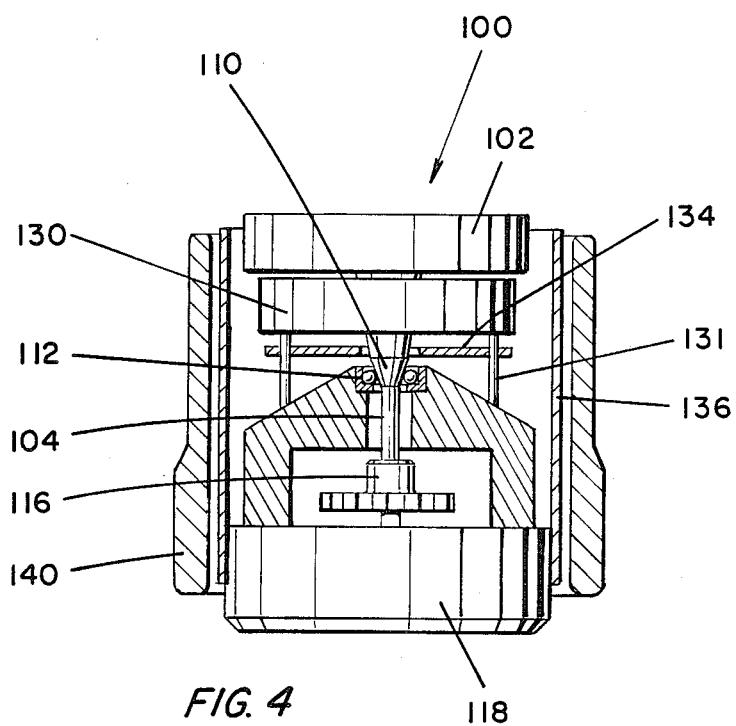
FIG. 4 is an elevational view, partly in section, of a manually operable, rotatable, heated work station of another preferred form which embodies the invention.
Figure 5:
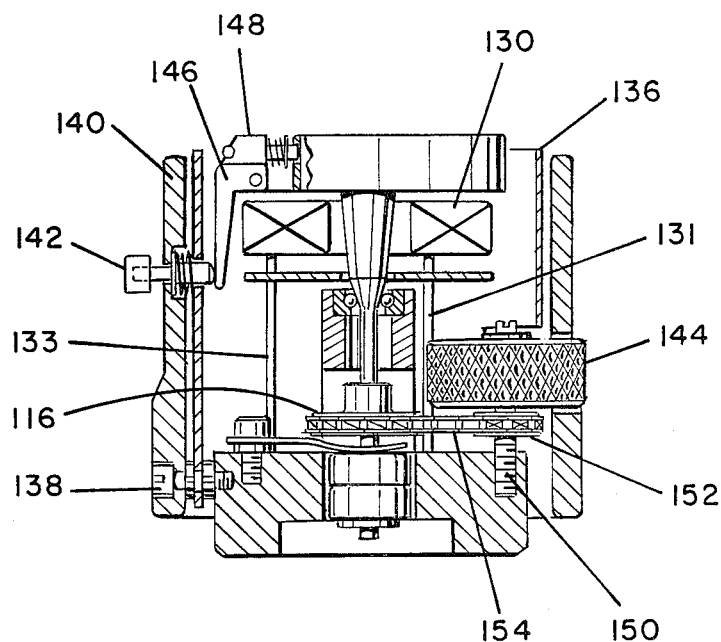
FIG. 5 is an elevational view, partly in section, of the unit of FIG. 4 rotated ninety degrees on its vertical axis.
Figure 6:
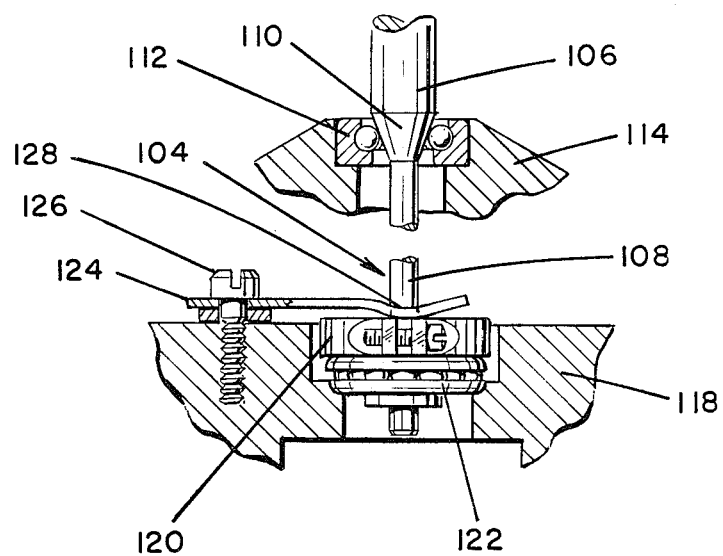
FIG. 6 is a schematic drawing of the bearing and bearing preload arrangement of FIG. 4.

Referring to FIGS. 4, 5 and 6, the worktable is numbered 102 and is mounted for rotation on a shaft 104 whose upper portion 106 is larger in diameter than lower portion 108. A tapered section 110 between them serves as the inner race of a tapered bearing 112 whose outer race is supported at the upper end of the pedestal 114. The lower portion of the pedestal is cut away to accommodate a large sprocket 116.

The sprocket is fixed to the shaft 104 which extends down into the base 118 where it continues through a collar 120 and a ball bearing 122. The collar is clamped on the shaft and the lower race of the bearing fixed to the base 118. The upper tapered bearing is preloaded by a cantilever leaf spring 124 which is bolted at one end to the upper surface of the base by a machine screw 126. The moveable end 128 of the leaf spring bears down on the upper side of collar 120. The shaft 104 extends through a hole, not shown, in the spring. The collar is spaced from the bearing to ensure that downward urging of the shaft is not overcome by engagement of the collar with the bearing if the shaft elongates with temperature increase.

The heater and shields are arranged as in the motorized unit. The heater 130 lies just below the worktable 102 and is held there by three slender posts 131, 132 and 133 which also support a reflector 134 just below the heater. A cylindrical reflector 136 surrounds the table and heater and pedestal. It is connected at its lower end to the base, but unlike shield 42 of FIGS. 1 and 32, the connection does not exclude air flow up through the shield. The unit is moved manually and it is possible for an operator to touch the base. To minimize heating of the base by conduction, the shield is spaced slightly from the base and is fixed to it by three pins spaced about its periphery. One of those pins is visible in FIG. 5. It is numbered 138. All three pins are formed by machine screws and spacers which hold both the cylindrical reflector 136 and a cylindrical outer casing 140. The casing has larger diameter and is spaced outwardly from the reflector. Its temperature must remain sufficiently low to permit handling by an operator. The operator grasps the casing not only in moving the whole unit but also in operating a spring loaded push button 142 and in turning the thumbwheel 144. The push button is mounted in a short shaft that extends through the casing 140 and reflector 136 where it engages and moves lever 146 when the button is depressed. The lever is pivotally mounted on one side of the worktable. When moved, it opens a spring closed clamp 148 carried on the table 102.

The thumbwheel 144 is mounted opposite the push button. It rotates on a shaft 150 which is carried by and extends upwardly from base 118 parallel to shaft 104. The wheel's edge extends through cutouts in the reflector 136 and casing 140. A small diameter sprocket 152 is fixed to the underside of the thumbwheel so that it lies in a common plane with the large sprocket 116. The two are interconnected by an endless chain 154 whereby rotation of the thumbwheel results in rotation of the sprockets and of shaft 104 and worktable 102. The chain presents a long, high resistance flowpath to minimize conduction of heat to the thumbwheel. The unit thus described is readily constructed in a size that can be moved manually and in which an operator can hold in one hand so that the thumbwheel can be operated with the thumb while the push button clamp can be actuated by one of the fingers. The arrangement for confining heat to the worktable makes the unit safe to handle even for an operator who must move and operate the apparatus while viewing only a very small area of the work or worktable through a microscope. That is in addition, of course, to greatly minimizing the effect of dimensional change with temperature from altering the position of the work.

The spring 124 serves, in this embodiment, both to preload the upper, tapered bearing 112 and to exert a frictional force against the collar 120. Friction at the point of engagement of the collar by the spring minimizes coating of the worktable, thumbwheel, and other rotatable elements of the unit.

In obedience to the rules, the best mode now known for practicing the invention has been shown in the accompanying drawing and described in the specification above. However, it is to be understood that other embodiments and variations of the invention are possible and that the invention is to be limited by what is defined in the appended claims rather than by what has been shown.

I claim:

1. In a work heater for a wire bonding machine:
   a turntable;
   a non-rotatable, radiant energy turntable heater disposed at the lower side of and proximate to said turntable;
   an elongated shaft fixed to said turntable and extending to said lower side of said turntable, the turntable and shaft being rotatable together about the axis of the shaft;
   a thrust bearing supporting said shaft subjacent to said turntable and heater against axial movement in the direction away from said turntable; and
   a spring positioned at the side of said bearing away from the turntable and heater and acting to urge said shaft in said direction away from the turntable, whereby displacement of said turntable is an incident to expansion and contraction of the length of said shaft.

2. The invention defined in claim 1 in which said thrust bearing is a tapered bearing tending to confine said shaft to rotation about the axis of said tapered bearing.

3. The invention defined in claim 2 which further comprises rotating means at the side of said tapered bearing away from said turntable for rotating said shaft.

4. The invention defined in claim 3 which further comprises a heat shield interposed between said heater and said rotating means.

5. The invention defined in claim 4 which further comprises a base, the end of said shaft being journalled in said base at the side of said rotating means and said heat shield away from said heater.

6. In a work heater for a wire bonding machine:
   a turntable;
   an elongated shaft fixed to said turntable and extending to one side of said turntable, the turntable and shaft being rotatable together about the axis of the shaft;
   a thrust bearing supporting said shaft against axial movement in the direction away from said turntable;
   a spring positioned at the side of said bearing away from the turntable and acting to urge said shaft in said direction away from the turntable;
   a non-rotatable, radiant energy turntable heater disposed proximate to said turntable;
   said thrust bearing being a tapered bearing tending to confine said shaft to rotation about the axis of said tapered bearing;
   rotating means at the side of said tapered bearing away from aid turntable for rotating said shaft;
   a heat shield interposed between said heater and said rotating means;
   a base, the end of said shaft being journalled in said base at the side of said rotating means and said heat shield away from said heater; and
   at least one post fixed to said base and extending past said heat shield to said heater, the heater being supported on the post.

7. The invention defined in claim 6 which comprises a second heat shield encompassing heater and said shield and extending to said base.

8. The invention defined in claim 7 which further comprises a collar fixed to and rotatable with shaft and in which said spring is carried by said base and bears against said collar.

9. In a work heater for a wire bonding machine:
   a turntable;
   an elongated shaft fixed to said turntable and extending to one side of said turntable, the turntable and shaft being rotatable together about the axis of the shaft;

a thrust bearing supporting said shaft against axial movement in the direction away from said turntable;

a spring positioned at the side of said bearing away from the turntable and acting to urge said shaft in said direction away from the turntable;

a non-rotatable, radiant energy turntable heater disposed proximate to said turntable;

said thrust bearing being a tapered bearing tending to confine said shaft to rotation about the axis of said tapered bearing;

rotating means at the side of said tapered bearing away from aid turntable for rotating said shaft; and further comprising a shaft sprocket fixed to said shaft and rotatable with said shaft and in which said rotating means comprises a manually rotatable sprocket carried on said base and a chain drive interconnecting said shaft sprocket and said rotatable sprocket.

10. In combination:

a turntable mounted at one end of an elongated shaft;

a belt pulley mounted on said shaft adjacent the other end of said shaft;

a heater mounted adjacent said turntable on the side toward said pulley;

a heat shield interposed between said heater and said pulley;

a drive motor having an output shaft;

a drive belt interconnecting the drive motor and said pulley;

a second heat shield, said second heat shield surrounding said heater and the margins of aid turntable;

a thrust bearing on which said shaft and turntable are mounted and which reacts to forces applied through said shaft in the direction from the turntable toward said pulley;

said thrust bearing being a tapered bearing serving to confine the axis of said shaft to the axis of said tapered bearing; and further comprising means for biasing said shaft in the direction from said turntable toward said pulley.

11. In combination:

a turntable mounted at one end of an elongated shaft;

a belt pulley mounted on said shaft adjacent the other end of said shaft;

a heater mounted adjacent said turntable on the side toward said pulley;

a heat shield interposed between said heater and said pulley;

a drive motor having an output shaft;

a drive belt interconnecting the drive motor and said pulley;

a second heat shield, said second heat shield surrounding said heater and the margins of aid turntable;

a thrust bearing on which said shaft and turntable are mounted and which reacts to forces applied through said shaft in the direction from the turntable toward said pulley;

said thrust bearing being a tapered bearing serving to confine the axis of said shaft to the axis of said tapered bearing; and further comprising a base and a pedestal, the pulley being housed in said base and said pedestal extending from the base toward said turntable, the shaft extending through said pedestal.

12. The invention defined in claim 11 in which said tapered bearing is mounted on said pedestal at the end toward said turntable.

13. In a work heater for a wire bonding machine:

a turntable;

an elongated shaft fixed to said turntable and extending to one side of said turntable, the turntable and shaft being rotatable together about the axis of the shaft;

a thrust bearing supporting said shaft against axial movement in the direction away from said turntable;

a spring positioned at the side of said bearing away from the turntable and acting to urge said shaft in said direction away from the turntable;

a non-rotatable, radiant energy turntable heater disposed proximate to said turntable;

further comprising a base, the end of said shaft away from said turntable being journalled in said base; and further comprising a pedestal extending from said base toward said heater, the shaft extending through said pedestal.

14. The invention defined in claim 13 which further comprises a first heat shield interposed between said heater and said base and a second heat shield encompassing and spaced between said heater and said pedestal.

15. The invention defined in claim 14 which further comprises at least one post fixed to said base and extending past said heat shield to said heater, the heater being supported on the post.

* * * * *